United States Patent
Yoon et al.

[11] Patent Number: 6,037,662
[45] Date of Patent: Mar. 14, 2000

[54] CHIP SCALE PACKAGE

[75] Inventors: Jin-hyun Yoon; Chung-woo Lee, both of Chungcheongnam-do, Rep. of Korea

[73] Assignee: Samsung Electronics Co., Ltd., Rep. of Korea

[21] Appl. No.: 09/154,665

[22] Filed: Sep. 18, 1998

[30] Foreign Application Priority Data

Oct. 15, 1997 [KR] Rep. of Korea ............... 97-052814

[51] Int. Cl.[7] .................................................. H01L 23/48
[52] U.S. Cl. ..................... 257/735; 257/734; 257/680; 257/669; 257/666; 257/784; 438/461; 438/611; 361/813
[58] Field of Search .................................. 257/669, 692, 257/735, 738, 773, 784, 666, 673, 674, 734, 668, 680; 361/772, 774, 776, 777, 813; 438/461, 611

[56] References Cited

U.S. PATENT DOCUMENTS 4,109,096  8/1978  Dehaine .......................... 174/68.5
5,148,265  9/1992  Khandros et al. .................. 357/80
5,866,949  2/1999  Schueller .......................... 257/778

FOREIGN PATENT DOCUMENTS 08316270  11/1996  Japan.

*Primary Examiner*—Steven H. Loke
*Assistant Examiner*—Luan Thai
*Attorney, Agent, or Firm*—Skjerven, Morrill, MacPherson, Franklin & Friel LLP; David T. Millers

[57] ABSTRACT

A patterned tape attached to a semiconductor chip in a chip scale package enhances process reliability in manufacturing of the chip scale package. A shape of the beam leads concentrates stresses in the part of the beam lead where the beam lead should be disconnected during the bonding of the beam leads to the chip bonding pads, and therefore, the part to be expected to be disconnected disconnects without damaging other parts of the beam lead. In addition, the reliability of a chip scale package is enhanced, because the beam lead attached to the chip bonding pad has little chance of being damaged during bonding.

29 Claims, 3 Drawing Sheets

CHIP SCALE PACKAGE

BACKGROUND OF THE INVENTION

1. Field of the Invention

The present invention relates to semiconductor chip packages, and more particularly to chip scale packages and tape for chip scale packages.

2. Description of the Related Art

In one exemplary assembly process, semiconductor chip packages are assembled through several processes. A semiconductor chip including a bonding pad is initially bonded on the surface of a die pad of a lead frame using an adhesive material. Inner leads of the lead frame are then electrically connected to the bonding pad of the semiconductor chip using a conductive wire. Thereafter, a portion including the semiconductor chip and the inner leads of the lead frame is encapsulated with a molding resin. The package is then subjected to a trimming and forming process and a plating process.

The conventional assembly process for semiconductor chip packages has a disadvantage in that the outer leads of the semiconductor chip package must be shaped for mounting on a printed circuit board (PCB). For example, the process forms the outer lead in a shape such as a gull wing shape or a J bend shape. Additionally, the package enclosing the semiconductor chip and a mounting member to be mounted on the PCB is larger than the semiconductor chip, and the outer leads of the semiconductor chip package are exposed. Accordingly, assembly of thinner and high density semiconductor chip packages is difficult.

Miniaturization of electronic equipments demands smaller semiconductor packages. However, a conventional plastic package, which includes a semiconductor chip and a lead frame in a molded body cannot be smaller than the semiconductor chip in the package. Further, the outer leads protruding from the molded body to be connected to a circuitboard make the conventional package even larger. To overcome the problems of conventional plastic packages, many kinds of new packages have been developed and introduced in electronic industry. Among them are a group of chip scale packages (CSPs), the sizes of which are almost the same as the semiconductor chips contained in the packages.

The structure of a conventional chip scale package will be briefly described hereinafter.

FIG. 1 is a top view of a patterned tape 10 which is bonded to the active surface of a semiconductor chip when forming a chip scale package. FIG. 2 is a schematic cross sectional view of a chip scale package including patterned tape 10.

As shown in FIG. 2, the chip scale package includes a semiconductor chip 1, a patterned tape 10, an adhesive layer 2 and solder balls 9. Patterned tape 10 is fabricated by laminating a copper film to a polyimide base film 6, and etching the copper film to form a pattern including beam leads 4, soldering pads 5 and conductor 7. In addition, as shown in FIG. 1, several windows (or slots) 8 in the patterned tape 10 allows bonding of beam leads 4 to chip bonding pads 3 of semiconductor chip 1. Beam leads 4 are typically plated with gold-nickel alloy. Polyimide base film 6 is also removed at soldering pads 5, where solder balls 9 attach. Solder balls 9 are tantamount to the outer leads of a conventional plastic package. The reference numeral 12 in FIG.1 represents an outline of the chip scale package, which is almost equivalent to the outline of semiconductor chip 1.

The manufacturing process of the chip scale package is briefly described hereinafter. First, patterned tape 10 is aligned above semiconductor chip 1, with each beam lead 4 being aligned over each corresponding chip bonding pad 3 of the semiconductor chip 1. After proper alignment, the patterned tape 10 is attached to the semiconductor chip 1 using an adhesive material 2 that includes an elastomer.

Thereafter, a heated capillary (not shown) presses each beam lead 4 from above to connect each beam lead 4 to a corresponding chip bonding pad. A sealing process applies sealing resin to the window of patterned tape 10 so that beam leads 4 and the active surface of semiconductor chip 1 exposed through windows 8 are encapsulated.

Then, solder balls 9 are positioned on soldering pads 5, and are connected to soldering pads 5 by a reflow process. Finally, patterned tape 10 is cut along line 12 to produce an individual chip scale package.

Beam leads 4, which connect to chip bonding pads 3 of semiconductor chip 1, are further described hereinafter.

FIG. 3 is a close-up view of portion A of FIG. 1. As shown in FIG.3, each beam lead 4 has a uniform width. Beam lead 4 exposed through the window 8 can be divided into three parts for the purpose of better understanding of the chip scale packages. The inner part of beam lead 4 which is close to conductor 7, the central part of beam lead 4, and the outer part of beam lead 4 which is close to the perimeter of the semiconductor chip are designated 4a, 4b and 4c, respectively.

In the bonding of each beam lead 4 to the corresponding chip bonding pad 3 pushes beam lead 4 downward. This applies mechanical stresses to beam leads 4. During this bonding process, outer part 4c of beam lead 4 must be disconnected to prevent any damage to the other parts of beam lead 4. However, when the width of beam lead 4 is uniform, the stresses are applied uniformly along the beam lead 4, and these stresses can severely damage cental part 4b and inner part 4a before outer part 4c is cut. Therefore, a method, that promotes the disconnection of outer part 4c of beam lead 4 without damaging the other parts of the beam lead 4 is desired.

SUMMARY OF THE INVENTION

It is therefore an object of the present invention to provide a chip scale package with a tape that improves the reliability of the process of manufacturing the chip scale package. The tape enables the beam lead to break at the point where the beam lead should disconnect. The weak portion of the beam lead breaks without damaging the other parts of the beam lead.

A chip scale package according to the present invention includes: a semiconductor chip having a plurality of chip bonding pads on the surface thereof; a patterned tape attached to the semiconductor chip using an insulating adhesive material; and a plurality of solder balls attached to the soldering pads of the tape. The tape includes a polyimide base film and a conductive copper pattern, which is composed of soldering pads, beam leads and conductors. The beam leads run across windows that are formed to allow the bonding between the chip pads and the beam leads. The insulating adhesive material preferably has thickness of 100 μm or less and may include elastomer. The soldering pads, the conductor and the beam leads can be plated with gold, tin or gold-tin alloy. Each beam lead runs across a window, the width of which is generally 0.3 mm or more, and can be divided into three parts: the inner part of the beam lead which is close to the conductor, the central part of the beam lead and the outer part of the beam lead which is close to the perimeter of the semiconductor chip.

In the present invention, the beam lead is shaped so that only the outer part of the beam lead breaks when the beam lead is pushed from the top to the chip bonding pad for bonding. The outer part of the beam lead ia made weaker than the other parts of the beam lead by reducing the width of the outer part of the beam lead. That is, the shape of beam lead concentrate the mechanical strain to the outer part of the beam lead in the bonding process, and result in the disconnection of the outer part of the beam lead without damaging the other parts of the beam lead.

According to an aspect of the present invention, the inner part of the beam lead has a greater width than the central part of the beam lead, which has a greater witdth than the outer part of the beam lead. The inner part of the beam lead extends from the conductor perpendicularly to a first longer side of the window. The central part changes its direction preferably by about 45°, extends nearly across the window, and changes its direction again by about 45° to return to be perpendicular to the second longer side of the window. The outer part of the beam lead is perpendicular to the second longer side of the window. The width of the central part of the beam lead is generally 40% to 70% of the width of the chip bonding pad. The width of the inner part of the beam lead is preferably at least 1.2 times greater than the width of the central part of the beam lead, and at least 2 times greater than the width of the outer part of the beam lead. Preferably, the width of the outer part of the beam lead is 5 to 20 μm.

According to another aspect of the present invention, the inner part of the beam lead is bifurcated and converges into the central part of the beam lead, leaving a narrow hexagonal or elliptical space between the two branches of the inner part of the beam lead. The central part of the beam lead which has a uniform width along the distance of the chip bonding pad tapers into the outer part of the beam lead. The central part of the beam lead is bonded to the chip bonding pad. The width of the outer part of the beam lead is less than 51% of the central part of the beam lead, and the width of each branch of the inner part is similar to the width of the central part.

BRIEF DESCRIPTION OF THE DRAWINGS

The above object and other advantages of the present invention will become more apparent by describing in detail the preferred embodiments thereof with reference to the accompanying drawings, in which.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete.

A tape in accordance with embodiment of the present invention has a feature in the shape of beam leads. Accordingly, the detailed description of the elements having basically the same function as previously described conventional elements are omitted below.

Figure 4:
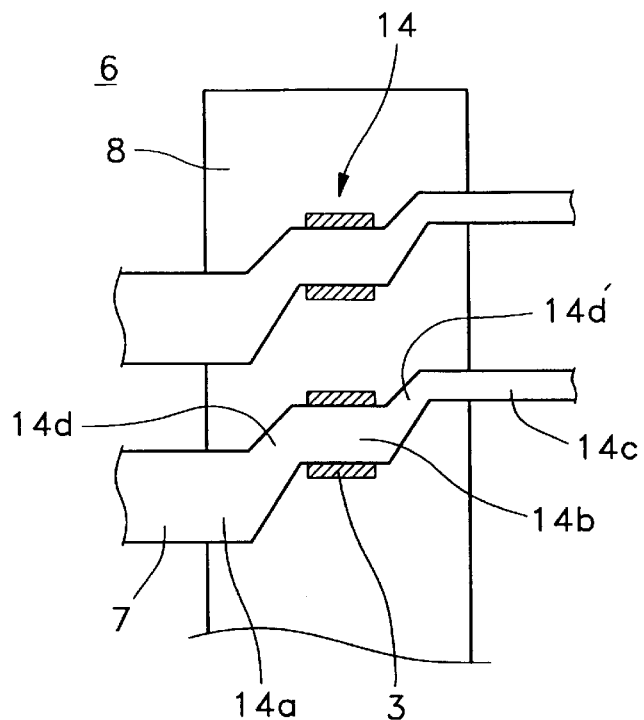
FIG. 4 is a top view of an embodiment of a beam lead according to the present invention.

FIG. 4 is a top view of an embodiment of a beam lead according to the present invention.

As shown in FIG. 4, a beam lead 14 extends from a conductor 7 formed on a base film 6 across a window 8. The inner part 14a of the beam lead 14 extends perpendicularly to a first longer side of window 8, and changes its direction by a predetermined angle to form a first connecting part 14d. First connecting part 14d connects to central part 14b of beam lead 14. This central part 14b extends approximately along the length of chip bonding pad 3 and changes its direction at a predetermined angle to form a second connecting part 14d'. Second connecting part 14d ' changes its direction again at outer part 14c of beam lead 14. Outer part 14c extends to the outside of window 8. Inner part 14a, central part 14b and outer part 14c are parallel one another. Windows 8 are formed along the edges of semiconductor chip 1 so that windows 8 expose chip bonding pads 3. Generally, window 8 has a width of approximately 0.3 mm.

Preferably, the angle by which each part of beam lead 14 changes direction is 45°. However, the angle may be varied according to the size of window 8 and beam lead 14.

The width of central part 14b of beam lead 14 is generally 40% to 70% of the width of chip bonding pad 3. The width of inner part 14a of beam lead 14 is preferably at least 1.2 times greater than the width of central part 14b of beam lead 14, and at least 2 times greater than the width of outer part 14c of beam lead 14. The typical width of outer part 14c of beam lead 14 is 5 to 20 μm.

In this embodiment, inner, central and outer parts 14a, 14b and 14c have respective uniform widths, and first and second connecting parts 14d and 14d' have a tapered shape. Alternately, inner, central and outer parts 14a, 14b and 14c may have a tapered shape, and first and second connecting parts 14d and 14d' may have respective uniform widths.

Figure 1:
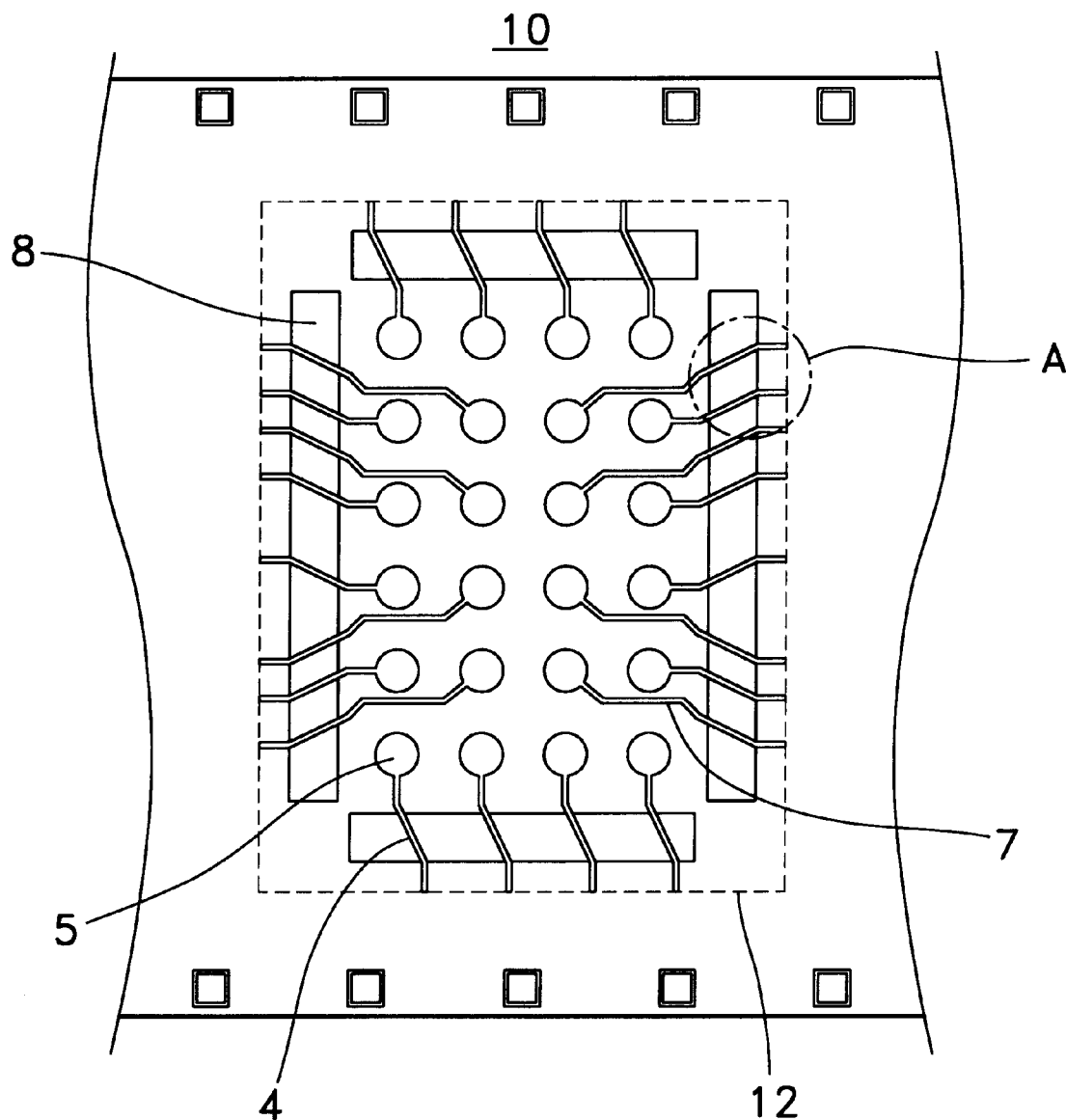
FIG. 1 is a top view of a patterned tape which is bonded to the active surface of a semiconductor chip.
Figure 2:
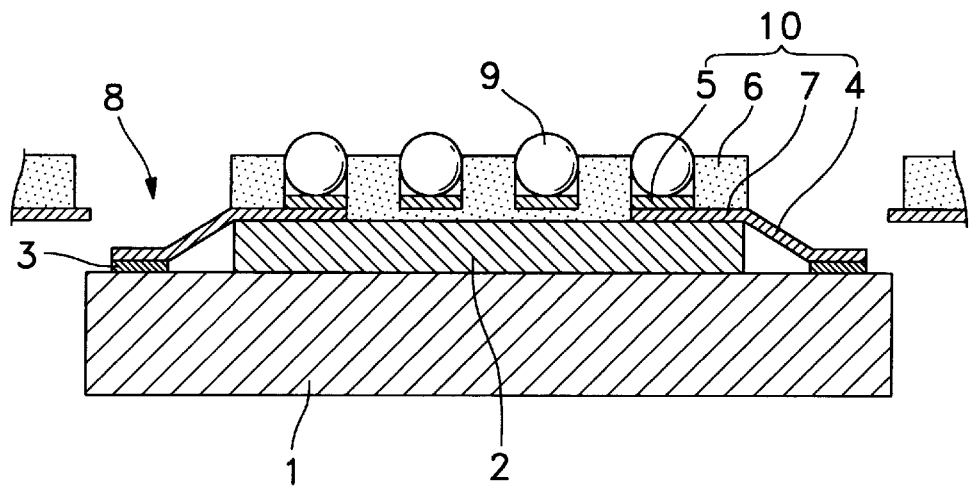
FIG. 2 is a schematic cross sectional view of a chip scale package including the patterned tape in FIG. 1.

As described earlier with respect to FIG. 2, a process for manufacturing the chip scale package bonds beam lead 4 to chip bonding pad 3 of a semiconductor chip 1. In the bonding step, a heated capillary (not shown) sequentially presses each beam lead 14 from the top to connect the beam lead 14 to a corresponding chip bonding pad 3 until all beam leads 14 are connected to the chip bonding pads 3.

Figure 3:
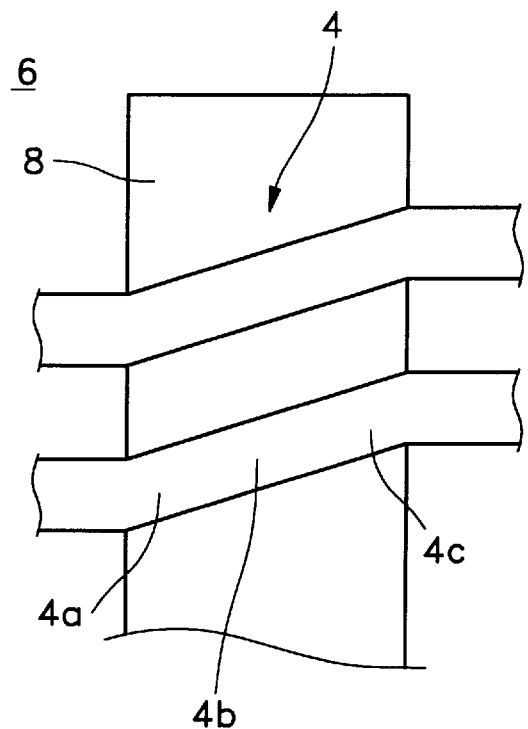
FIG. 3 is an enlarged view of a portion A of FIG.1.

In bonding of the beam lead 14 to the chip bonding pad 3, when the capillary presses central part 14b of beam lead 14, beam lead 14 moves downward a distance determined by the height of adhesive layer 2. Adhesive layer 2 typically has a thickness of 100μm or less, which is greater than the height of the chip bonding pad 3. The capillary applies mechanical stresses to beam lead 14. In case of the conventional design of the beam lead 4 shown in FIG. 3, since the stresses are uniform along beam lead 4 due to its uniform width, central part 4b and inner part 4a of beam lead 4 can be damaged before outer part 4c is disconnected.

However, the present invention shown in FIG. 4 can prevent this problem of the conventional beam lead 4. When the capillary pushes beam lead 14 downward, the stresses applied to central part 14b is equally transferred to inner part 14a and outer part 14c. Even though the amount of the stresses transferred to inner part 14a is equal to that transferred to outer part 14c, the stresses applied to the unit area of outer part 14c is greater than those applied to the unit area of inner part 14a, because the width of outer part 14c is smaller than that of inner part 14a. As a result, only outer part 14c of the beam lead 14 breaks, leaving no damage on inner part 14a and central part 14b. Moreover, beam lead 14 of FIG. 4 is longer than beam lead 4 of FIG. 3. This means that beam lead 14 stretches less than beam lead 4 during bonding and thereby, the bonding damages inner part 14a less than inner part 4a. In addition, first connecting part 14d can act as a stress buffer zone for inner part 14a of beam lead 14.

Figure 5:
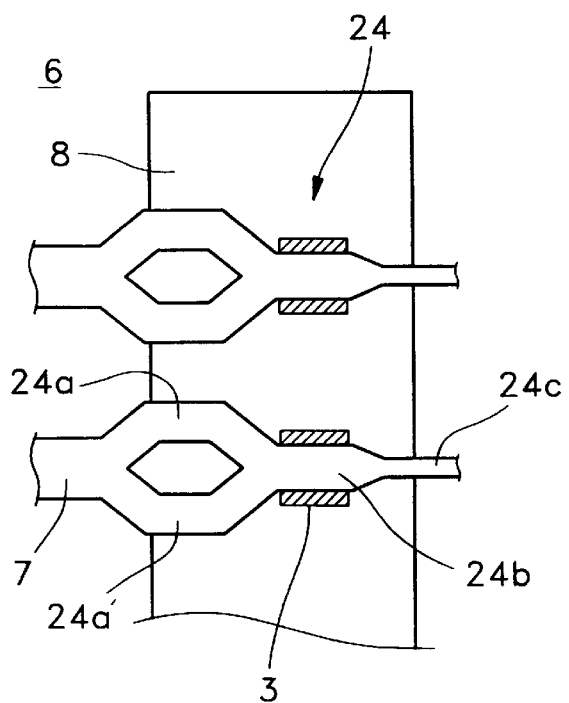
FIG. 5 is a top view of another embodiment of a beam lead according to the present invention.

FIG. 5 is a top view a beam lead 24 according to another embodiment of the present invention.

In this embodiment, conductor 7, which is perpendicular to the longer side of window 8, branches to form two inner part 24a and 24a' of beam lead 24. Branches 24a and 24a' converge into a central part 24b of beam lead 24, leaving a narrow hexagonal or elliptical space between the two branches 24a and 24a' of beam lead 24. Central part 24b of beam lead 24 has a uniform width along the length of chip bonding pad 3 and tapers to form an outer part 24c of beam lead 24. Bonding connects central part 24b of beam lead 24 to chip bonding pad 3 and disconnects central part 24b from outer part 24c. The width of outer part 24c of beam lead 24 is less than 51% of central part 24b of beam lead 24, and the width of each branch of the inner part 24a and 24a ' is similar to the width of central part 24b.

When a capillary applies stresses to central part 24b of beam lead 24, an equal amount of stress are transferred to inner parts 24a and 24a ' and outer part 24c. However, assuming the width of each inner part 24a and 24a ' is the same as the width of central part 24b, the stresses applied per unit area of each inner part 24a and 24a ' is approximately half of those applied per unit area of central part 24b. The stresses applied per unit area of outer part 24c is greater than those applied per unit area of central part 24b. Accordingly, outer part 24c of beam lead 24 deforms, breaks and leaves no damage on inner parts 24a and 24a ' and central part 24b.

In summary, the present invention promotes disconnection of the outer part of a beam lead without damaging on the other parts of the beam lead, by concentrating stresses and strains in the outer part of the beam lead. The concentration of stresses in the outer part can be accomplished by shaping of the beam lead. Although the present invention has been described with reference to the aforementioned embodiments, it is evident that many alternatives, modifications and variations will be apparent to those having skills in the art in light of the foregoing description. Accordingly, all of such alternatives, modifications and variations are within the spirit and scope of the invention as defined by the following claims.

What is claimed is:

1. A chip scale package comprising:
    a semiconductor chip including a bonding pad formed on a surface thereof;
    a tape attached to said semiconductor chip using an adhesive material in such a manner that said bonding pad is exposed, said tape including a conductive pattern formed therein, said conductive pattern extending as a beam lead outwardly over said bonding pad; and
    a plurality of solder balls electrically connected to said conductive pattern of said tape,
    wherein said beam lead includes:
        an inner portion that extends in a first direction;
        a first connecting portion that extends from said inner portion in a second direction that at an angle with said first direction;
        a central portion that is narrower than the inner portion and extends from said first connecting portion in said first direction;
        a second connecting portion that extends from said central portion in said second direction; and
        an outer portion that is narrower than the central portion and extends from said second connecting portion in said first direction,
    wherein said central portion contacts said bonding pad to form an electrical connection.

2. The chip scale package according to claim 1, wherein said angle is 45 degrees.

3. The chip scale package according to claim 1, wherein said central portion has a width of 40% to 70% of a width of said bonding pad.

4. The chip scale package according to claim 1, wherein each of said inner portion, said central portion, and said outer portion has a respective uniform width.

5. The chip scale package according to claim 4, wherein said inner portion has a width that is twice or more than twice as large as a width of said outer portion.

6. The chip scale package according to claim 4, wherein said inner portion has a width that is 1.2 times or more as large as a width of said central portion.

7. The chip scale package according to claim 1, wherein said outer portion has a width of 5 to 20 μm.

8. The chip scale package according to claim 1, wherein said adhesive material includes an elastomer.

9. The chip scale package according to claim 8, wherein said adhesive material has a thickness of 100 μm or less.

10. The chip scale package according to claim 1, wherein said conductive pattern is formed by laminating and patterning a copper thin film on a base film.

11. The chip scale package according to claim 10, wherein said conductive pattern is plated with any material selected from a group consisting of gold, tin, and an alloy of gold and tin.

12. A chip scale package comprising:
    a semiconductor chip including a bonding pad formed on a surface thereof;
    a tape attached to said semiconductor chip using an adhesive material in such a manner that said bonding pad is exposed, and said tape including a conductive pattern, said conductive pattern extending as a beam lead over said bonding pad; and
    a plurality of solder balls electrically connected to said conductive pattern of said tape, wherein said beam lead includes:
        a first and a second inner portions that are spaced apart by a first distance;
        a central portion formed by joining said first and second inner portions and extending from said joined first and second inner portions in a first direction of said first and said second inner portions; and
        an outer portion that is narrower than the central portion extends from said central portion,
    wherein said central portion contacts said bonding pad to form an electrical connection.

13. The chip scale package according to claim 12, wherein said central portion has a uniform width at a portion bonded to said bonding pad and is tapered at other portions thereof except for said portion bonded to said bonding pad.

14. The chip scale package according to claim 12, wherein a width of said outer portion is one half or less of a width of said central portion.

15. The chip scale package according to claim 12, wherein each of said first and second inner has a width that is approximately equal to a width of the central part.

16. The chip scale package according to claim 12, wherein said central portion has a width of 40% to 70% of a width of said bonding pad.

17. The chip scale package according to claim 16, wherein a shape formed between said first and said second inner portions is any of a hexagonal shape and an elliptic shape.

18. The chip scale package according to claim 12, wherein said conductive pattern is formed by laminating and patterning a copper thin film on a base film.

19. The chip scale package according to claim 18, wherein said conductive pattern is plated with any one selected from a group consisting of gold, tin, and an alloy of gold and tin.

20. A tape for use in a chip scale package, comprising:
   a base film including a window having a predetermined width; and
   a conductive pattern on said base film, said conductive pattern including:
      a beam lead extending over said window; and
      a soldering pad for bonding a solder ball thereto,
   wherein said beam lead includes:
      an inner portion extending in a first direction;
      a first connecting portion extending from said inner portion in a second direction that is at an angle with said first direction;
      a central portion extending from said first connecting portion in said first direction;
      a second connecting portion extending from said central portion in said second direction; and
      an outer portion extending from said second connecting portion in said first direction,
      wherein said central portion is wider than said outer portion and is positioned for contacting a bonding pad of a semiconductor chip to form an electrical connection between said semiconductor chip and said beam lead, and said inner portion is wider than said central portion.

21. The tape according to claim 20, wherein said width of the window is 0.3 mm or more.

22. The tape according to claim 20, wherein said angle is 45 degrees.

23. The tape according to claim 20, wherein said inner portion has a width that is two or more times larger than a width of said outer portion.

24. The tape according to claim 20, whererin the inner part has a width that is 1.2 times or more as large as the width of the central part.

25. The tape according to claim 20, wherein said outer portion has a width of 5 to 20 $\mu$m.

26. A tape for use in a chip scale package, comprising:
   a base film including a window having a width;
   a conductive pattern formed on said base film, said conductive pattern including:
      a beam lead extending over said window; and
      a conductive pad for bonding a solder ball thereto,
   wherein said beam lead includes:
      a first and a second inner portions that are spaced apart;
      a central portion joining said first and said second inner portions and extending from said joined first and second inner portions in a direction of said first and second inner portions; and
      an outer portion formed by extending said central portion in a direction of said central portion,
      wherein said central portion is wider than said outer portion and is positioned for contacting a bonding pad of a semiconductor chip to form an electrical connection between said semiconductor chip and said beam lead.

27. The tape according to claim 26, wherein said central portion has a width that tapers toward said outer portion.

28. The tape according to claim 26, wherein said inner portion has a width that is 1.2 times or less larger than a width of said cental portion.

29. The tape according to claim 26, wherein each of inner portions has a width that is approximately equal to a width of said central part.

* * * * *